United States Patent
Rodgers

(10) Patent No.: US 7,389,920 B2
(45) Date of Patent: Jun. 24, 2008

(54) WIRELESS INVENTORY RE-ORDERING SYSTEM FOR SURFACE MOUNT TECHNOLOGY PICK AND PLACE ASSEMBLY MACHINES

(75) Inventor: Terry D. Rodgers, Smithtown, NY (US)

(73) Assignee: Honeywell International Inc., Morristown, NJ (US)

( * ) Notice: Subject to any disclaimer, the term of this patent is extended or adjusted under 35 U.S.C. 154(b) by 535 days.

(21) Appl. No.: 10/780,983

(22) Filed: Feb. 18, 2004

(65) Prior Publication Data

US 2005/0178811 A1   Aug. 18, 2005

(51) Int. Cl.
*G06F 19/00* (2006.01)

(52) U.S. Cl. .................................. 235/385; 235/492

(58) Field of Classification Search ............... 235/385, 235/375, 488, 492
See application file for complete search history.

(56) References Cited

U.S. PATENT DOCUMENTS

| | | | | |
|---|---|---|---|---|
| 3,646,323 A * | 2/1972 | Young et al. | ................. | 235/476 |
| 5,419,802 A | 5/1995 | Nakatsuka et al. | | |
| 5,456,545 A * | 10/1995 | Sims et al. | ................. | 400/708 |
| 5,674,803 A * | 10/1997 | Delaney | ................. | 503/206 |
| 6,478,229 B1 * | 11/2002 | Epstein | ................. | 235/492 |
| 6,739,512 B2 * | 5/2004 | Guerrero et al. | ........ | 235/462.01 |
| 6,779,726 B1 * | 8/2004 | Easton | ................. | 235/462.01 |
| 7,114,655 B2 * | 10/2006 | Chapman et al. | ........ | 235/462.01 |
| 2004/0094630 A1 * | 5/2004 | Tani | ........................... | 235/487 |

OTHER PUBLICATIONS

EIA Standard EIA-481, Rev. A, "Taping of Surface Mount Components for Automatic Placement" (excerpts), 5 pp., Feb. 1986.
Radial 5 Operator Manual 46688101, Rev. A, Universal Instruments Corp., Binghamton, NY, 3 pp., Sep. 1997.

* cited by examiner

*Primary Examiner*—Ahshik Kim
(74) *Attorney, Agent, or Firm*—Scully, Scott, Murphy & Presser, P.C.

(57) ABSTRACT

A system and method for determining when a component supply reel for an automated assembly machine is close to depletion. The supply reel tape has indications such as marks that can be optically or magnetically read by a reader through which the tape passes as it is fed into the automated assembly machine, such as a surface mount technology (SMT) pick and place machine. Or, an RF tag may be used. The reader activates a transmitter, which transmits a signal to a local computer. The computer generates a message such as an e-mail for a supply facility computer to notify a worker to deliver a replacement reel. The marks are provided at a desired location along the length of the tape. In another approach, a message is generated when depletion of the reel is detected by a switch.

20 Claims, 4 Drawing Sheets

WIRELESS INVENTORY RE-ORDERING SYSTEM FOR SURFACE MOUNT TECHNOLOGY PICK AND PLACE ASSEMBLY MACHINES

BACKGROUND OF THE INVENTION

1. Field of Invention

The invention relates generally to a method and system for determining when a component reel for an automated assembly machine is depleted, and for automatically notifying a supply facility that an additional component reel of the same type is needed.

2. Description of Related Art

Manufacturers, such as those in the electronics industry, commonly use tape and reel supply of small discrete parts, such as electrical and mechanical components, for automatic pick and place assembly onto a printed circuit board (PCB) or other substrate. Electronics components such as integrated circuits, resistors, capacitors and the like may be delivered to a pick and place machine. Typically, the pick and place machine has a number of feeders which are arranged to deliver their components in parallel, where each feeder supports a tape reel carrying a different component. Moreover, the components may be carried by the tape in different ways. In one common approach, as illustrated in FIG. 1, a plastic carrier tape 100 is provided with successive embossments or pockets 110 at equal longitudinal intervals. Each embossment 110 carries a separate component, not shown, and is covered by a continuous strip or top cover tape 115. The tape 100 is wound on a reel 150. Alternatively, a paper carrier tape is punched to provide successive pockets. In another possible approach, the carrier tape includes holes that expose an underlying adhesive tape to which the electronic components are adhered. The pick and place machine separates the continuous strip 115 from the carrier tape 100 and removes each component from its pocket.

In either case, the tape typically includes sprocket holes 120 (FIG. 1) along one or both side edges to allow the tape to be fed by gears/sprockets. The pick and place machine places the component under precise computer control onto a given location on the PCB, which usually has solder paste applied at precise locations that temporarily holds the component in place until solder reflow.

Typically, a number of pick and place machines that are present in a production line may be periodically monitored by a production line worker. When a reel has been depleted, the associated machine stops running. When the production line worker notices this, he or she must obtain a replacement reel, such as by telephoning a nearby stock room worker. The production line worker notes the identifying information of the depleted reel, such as a stock number, and the identifying information of the machine, such as its location or other identifier, and relays the information to the stock room worker. The stock room worker locates the appropriate reel from inventory and has it delivered to the location of the machine at issue. This can take several minutes. This process is obviously inefficient and subject to miscommunication, e.g., in the conveying of the identifying information. Moreover, the manufacturing process is burdened with low efficiencies since the high-cost pick and place machines sit idle while exhausted component reel/feeders are replenished.

BRIEF SUMMARY OF THE INVENTION

To overcome these and other deficiencies in the prior art, the present invention describes a method and system for determining when a component reel for an automated assembly machine is depleted, and for automatically notifying a supply facility that an additional component reel is needed.

In one approach, a wireless communication from a transmitter near the component reel is interfaced to a networked computer. An e-mail is automatically generated and sent to an inventory control worker, who pulls a replacement reel of the same type from stock and delivers it to the machine. This is all achieved prior to the existing reel becoming exhausted by the placement machine. The invention thus improves productivity and profitability for the manufacturer.

In particular, one aspect of the invention provides an inventory management apparatus for an automated assembly machine that is fed components from a component reel, where the component reel comprises a tape having the components carried at periodic locations along the tape. The apparatus includes a reader for reading the tape, as the tape is fed to the automated assembly machine, to detect at least one indication on the tape, and a transmitter responsive to the reader for transmitting a signal when the at least one indication is detected by the reader.

A corresponding inventory management method is also presented.

Another aspect of the invention provides a component reel for an automated assembly machine that includes a tape having components carried at periodic locations along the tape, and at least one indication at a location on the tape at which a predetermined portion of the component reel has been depleted. The at least one indication is adapted to be detected by a reader as the tape is fed to the automated assembly machine.

Another aspect of the invention provides an inventory management apparatus for an automated assembly machine that is fed components from a component reel. The apparatus includes first and second pinch rollers through which the tape travels as the tape is fed to the automated assembly machine. The first and second pinch rollers are arranged in an electrical circuit. Travel of the tape through the first and second pinch rollers prevents the first and second pinch rollers from contacting one another and closing the electrical circuit. When the tape no longer travels through the first and second pinch rollers, indicating that the component reel has been depleted, the first and second pinch rollers contact one another, thereby closing the electrical circuit. The apparatus also includes a switch in the electrical circuit for detecting when the electrical circuit is closed, and a transmitter responsive to the switch for transmitting a signal when the electrical circuit is closed.

A corresponding method is also presented.

BRIEF DESCRIPTION OF THE DRAWINGS

These and other features, benefits and advantages of the present invention will become apparent by reference to the following text and figures, with like reference numbers referring to like structures across the views, wherein.

DETAILED DESCRIPTION OF THE INVENTION

The invention provides a system and method for automatically ordering replacement component reels for automated assembly machines when the reels have been depleted or are nearing depletion.

Figure 1:
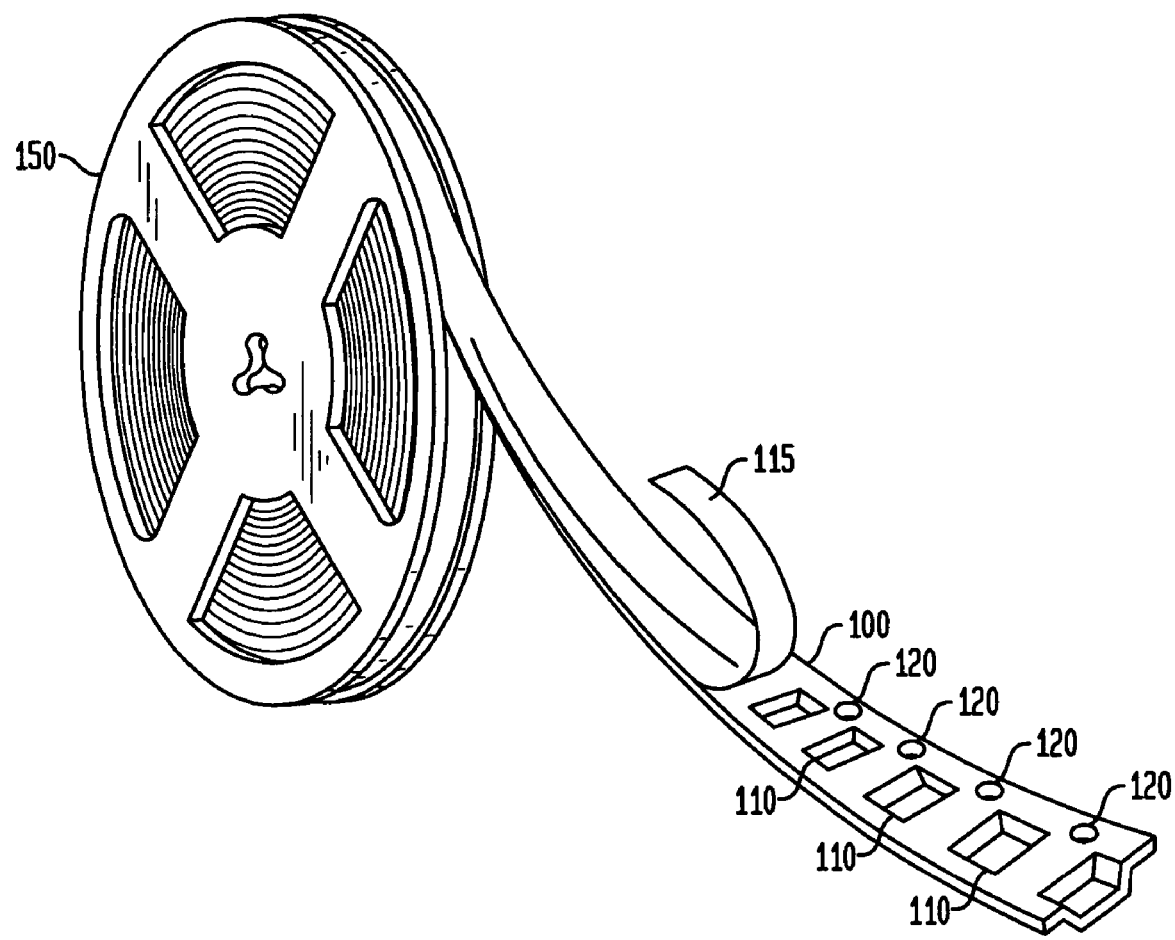
FIG. 1 illustrates a prior art supply reel.
Figure 2:
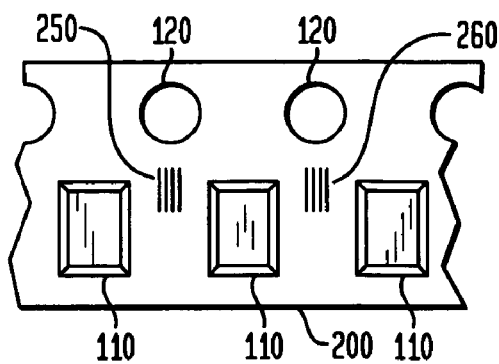
FIG. 2 illustrates a tape for a component supply reel with optically readable marks according to the invention.

FIG. 2 illustrates a tape 200 for a component supply reel with optically readable marks 250 and 260 according to the invention. The marks, also referred to as indicia or indications, may be provided as dark marks on a contrasting light colored background, for example. The marks may extend in the direction of the tape so that they can be read as the tape is fed into the automated assembly machine. Any suitable marks can be used that can be optically read. The marks can include any type of indicia that can be detected as being different from remaining portions of the tape that do not include the mark. The size and shape of the marks should be based on the speed with which the tape is advanced, and the capability of the reader that is used.

In one approach, a series of repeated lines of constant thickness can be used. In another possible approach, the marks are obtained by providing the tape with a contrasting shade along the entire width of the tape at a predetermined location on the tape 200. Moreover, the same mark or pattern of marks can be repeated on the tape so that the marks are sure to be read by the reader. The marks can be provided along the centerline of the tape, or along one or both sides of the centerline, for instance.

When these marks are read, it can be concluded that a predetermined portion of the component supply reel has been depleted. The marks can be pre-positioned on the tape 200 as desired. For example, it may be desired to signal when 80% of the component supply reel has been depleted. In this case, the marks are made at a location that is at 80% of the length of the tape. With use of the signaling mechanism described further below, this allows a certain amount of lead time for a new component supply reel to be delivered, such as from a supply facility, e.g., warehouse, in the same building as the production line or in a nearby building. In another possibility, different marks are provided at different locations on the tape to signal that a different portion of the component supply reel has been depleted. For example, first and second types of marks may be positioned at 80% and 90%, respectively, of the length of the tape. In this case, a first alert can signal that 80% of the component supply reel has been depleted, while a second, higher-priority alert signals that 90% of the component supply reel has been depleted.

The manufacturer of the tape or of the component supply reel may provide the marks on the tape. It is also possible to provide the marks after the tape has been wound onto the reel. For example, when the tape is made of paper or other absorbent material, a few drops of ink can be applied to the reel at a location near the inner diameter of the reel. With the reel positioned horizontally, the ink will be absorbed at periodic locations along the tape that correspond to the circumference of the reel at the location. The absorbed ink will form marks on the tape that can be optically detected.

The marks may be provided using any suitable ink or other material that is compatible with the tape. Examples include ink jet printing, laser marking, laser printing, electrographic printing, flexographic printing, thermal printing, thermal transfer printing, thermal printing and electrographic printing.

The EIA-481 standard is the SMT industry standard used by component manufacturers to package components into reels. It is suggested that this standard can be modified to accommodate the marking scheme proposed by the invention.

Figure 3:
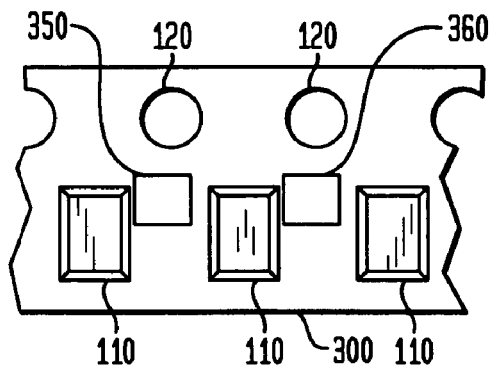
FIG. 3 illustrates a tape for a component supply reel with magnetically readable marks according to the invention.

FIG. 3 illustrates a tape 300 for a component supply reel with magnetically readable marks 350 and 360 according to the invention. The marks, also referred to as indicia or indications, may be provided using a magnetic material. For example, the magnetic material may be similar to a cassette tape, which comprises a thin plastic base material. A coating of ferric oxide powder is bonded to the base. The oxide is normally mixed with a binder to attach it to the plastic, and it may also include a dry lubricant to avoid wearing out the reading head. The oxide is a ferromagnetic material that is permanently magnetized when exposed to a magnetic field. The material can thus be magnetized and detected by a reading head similar to the head of a cassette tape player.

The magnetic material can be bonded to the tape 300 using adhesive, for instance, to provide the magnetic marks 350 and 360. The mere presence of the marks can signal that a portion of the component supply reel has been depleted. Moreover, data may be encoded into the magnetic material, such as an identifier of the component supply reel, and/or an indication of what portion of the component supply reel has been depleted, e.g., 80%. The marks may have essentially any configuration that can be read by a magnetic reader.

Figure 4:
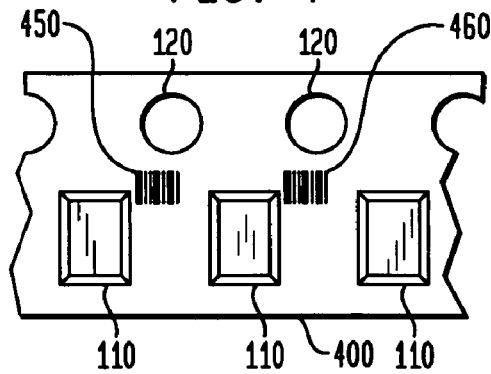
FIG. 4 illustrates a tape for a component supply reel with an optically readable bar code according to the invention.

FIG. 4 illustrates a tape 400 for a component supply reel with optically readable bar codes 450 and 460 according to the invention. The bar codes 450 and 460, also referred to as indicia or indications, can be provided according to any known coding scheme, including one-dimensional and/or two-dimensional bar code types. Moreover, the bar code may encode information that identifies a type of the component supply reel, such as a stock number or the like. The bar code may also encode information that identifies the portion of the component supply reel that has been depleted. Other information such as the date of manufacture of the tape can also be encoded.

Figure 5:
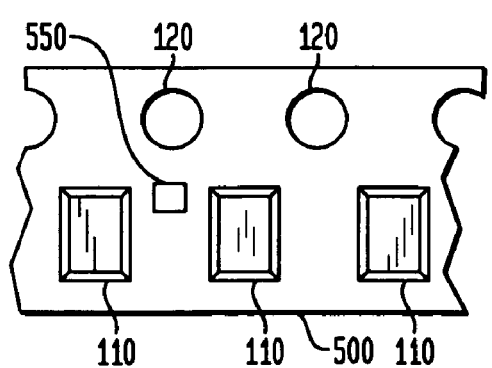
FIG. 5 illustrates a tape for a component supply reel with an RF tag according to the invention.

FIG. 5 illustrates a tape for a component supply reel with an RF tag 550 according to the invention. The RF tag 550 is an indication or indicium that can be adhered to the carrier tape 500 using adhesive, for example. Radio frequency identification tags, also referred to as electronic bar codes or smart labels, are expected to become commonplace in inventory tracking applications. These types of tags include inductively coupled tags, which are powered by the magnetic field generated by a reader. The tag's antenna picks up the magnetic energy, and the tag communicates with the reader. The tag then modulates the magnetic field in order to retrieve and transmit data back to the reader. Data is transmitted back to the reader, which directs it to a host computer. This type of RF tag includes a silicon microprocessor, a metal coil antenna operating, e.g., at 13.56 MHz, and an encapsulating material such as glass or polymer material that wraps around the chip and coil.

Capacitively coupled RFID tags do not use a metal coil, but use a small amount of silicon to perform that same function as a inductively coupled tag. This type of tag includes a silicon microprocessor and a conductive carbon ink antenna. The silicon chip is attached to printed carbon-ink electrodes on the back of a paper label, creating a low-cost, disposable tag that can be integrated on conventional product labels. These tags are also more flexible than the inductively coupled tag. In contrast to the magnetic energy that powers the inductively coupled tag, capacitively coupled tags are powered by electric fields generated by a reader. One example is Motorola's BiStatix RFID tag, which has a range of about 1 cm. Generally, a tag should be used whose range is small enough so that the tag cannot be read until the tag is immediately next to the reader.

The RF tag 550 may encode information as discussed in connection with the bar code of FIG. 4. Generally, it is expected that RF tags will be able to carry a significantly greater amount of information than an equivalently sized bar code.

Figure 6:
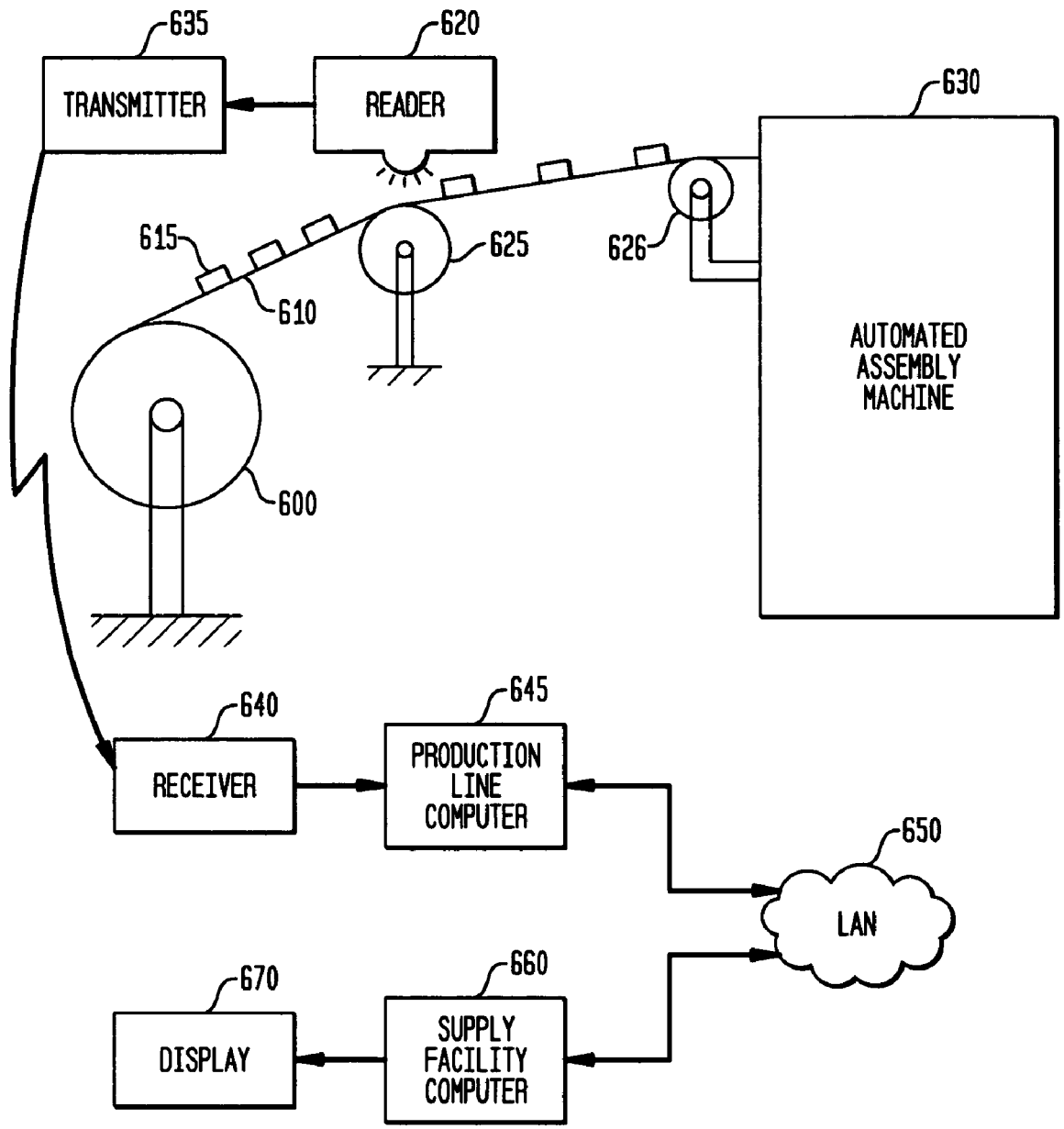
FIG. 6 illustrates a system for signaling when a predetermined portion of a supply reel has been depleted.

FIG. 6 illustrates a system for signaling when a predetermined portion of a supply reel has been depleted. The component supply reel 600 supplies a tape 610, which carries the components 615, to the automated assembly machine 630, such as an SMT pick and place machine, as discussed previously. The tape 610 is shown being guided by example rollers 625 and 626. The system of FIG. 6 is simplified to improve understanding. In practice, various other mechanisms, which will be apparent to those skilled in the art, are used for advancing and guiding the tape, such as motors, gears, and the like. Moreover, typically there are several component supply reels fed into the automated assembly machine 630 in parallel, e.g., at the same time. The techniques described herein can be applied to each component supply reel.

A reader 620 is positioned to read the indications or indicia on the tape, such as the optical, magnetic or RF tag indications, as the tape 610 passes over the roller 625. The reader 620 may be an optical, magnetic and/or RF reader. For example, an optical reader such as a bar code reader may be used to read an optical mark such as a bar code. A bar code reader or scanner scans a bar code symbol to capture the bars and spaces of the bar code. A decoder translates the bars and spaces into a corresponding electrical output, and transmits that data to a computer in a traditional data format. Different types of bar code readers include Laser Bar code Scanners, which use a laser beam as their light source, and typically employ either a reciprocating mirror or a rotating prism to scan the laser beam back and forth across the bar code. A photo diode is used to measure the intensity of the light reflected back from the bar code. Charge Couple Device (CCD) bar code scanners use an array of tiny light sensors lined up in a row in the head of the bar code reader. Voltage waveform corresponding to the bars and spaces of the bar code is generated and sent to a decoder, which decodes the data and sends it to a computer. A camera based bar code reader uses a small video camera to capture an image of a bar code. The bar code reader then uses digital image processing techniques to decode the bar code. The optical reader 620 can be configured according to the type of mark that is used to recognize the mark.

The reader 620 may also be a magnetic reader for reading a magnetic mark or indicia. For example, a magnetic reader that operates similar to a cassette tape reader may be used. The reading head senses the magnetic marks on the tape 610 as the tape 610 passes the head.

An RF reader may be used to read an RF tag or indicium as discussed in connection with FIG. 5. An RF reader should be positioned so that it reads the RF tag only when the RF tag is very close to the reader. This can be achieved by selecting an RF tag with an appropriate range, and/or by shielding the reader from the RF tag until the RF tag is very close to the reader. Such readers are available from various suppliers.

Regardless of the reader type, the tape 610 is guided using appropriate mechanisms so that it is at a suitable position with respect to the reader 620 to be read.

When the reader 620 reads the tape 610, it activates a transmitter 635 to transmit a signal via a wireless or wired path. In one possibility, the transmitter 635 is analogous to the type used in home security systems for transmitting an intruder alert from a window or door sensor to a control panel in a house or other structure. This type of transmitter transmits a signal that is encoded with an identifier of the transmitter, such as a serial number.

A receiver 640 receives the signal. Depending on the strength of the transmission and other considerations, the receiver 640 may be located, e.g., several feet or hundreds of feet from the transmitter 635. For instance, the transmitter 635 may use narrowband wireless RF signals at 345 MHz to provide a nominal indoor range of 200 feet. Any type of coding and modulation technique may be used. The receiver 640 is of a type that is compatible with the transmitter 635. In the example shown, the receiver 640 is assumed to be relatively close, e.g., several feet, to the automated assembly machine 630 and the component supply reel 600. Multiple component supply reels that feed the same automated assembly machine may use the same transmitter and receiver if the transmitter encodes its transmission with data that identifies a particular reel. In this case, the reader for each component supply reel can communicate with the same transmitter. When multiple automated assembly machines are located near one another, such as on a production line, the transmitter and receiver for each automated assembly machine may be configured to avoid interference, such as by using different frequencies. It is also possible to use a separate transmitter for each reel, and a common receiver, or a separate transmitter and receiver pair for each reel.

When the receiver 640 receives the signal from the transmitter 635, it notifies a production line computer 645. The computer 645 is shown as being a production line computer, which means it is located on or near the production line and the automated assembly machine 630. The computer 645 may be a general-purpose computer such as a PC or workstation. The computer may be programmed to perform other tasks relating to the automated assembly machine 630. One computer may be used for multiple automated assembly machines, or one computer may be associated with each automated assembly machine. Note that the receiver 640 may be a peripheral or built-in component of the production line computer 645. For example, a Wi-Fi (IEEE 802.11b) card may be used.

The production line computer 645 is programmed to communicate a message when it learns that the receiver 640 has received the signal from the transmitter 635. For example, the production line computer 645 may communicate a message to a computer 660 at a supply facility or warehouse via a network 650 such as a local area network (LAN). The LAN may be wired and/or wireless. The message may include a notification to supply the automated assembly machine 630 with an additional component reel of the same type as the component reel 600, which is nearing depletion. The message can be displayed on a display device 670 to notify a supply facility worker to take action by locating a new component supply reel of the correct type and having it delivered to the location of the automated assembly machine. The message communicated by the production line computer 645 can be of any type. For example, an e-mail or TCP/IP message may be used. A message can be conveyed by other means, as well, such as by pager, cell phone or radio.

The production line computer 645 may be programmed with software that reacts to an input signal from the receiver 640 by sending a message that contains information obtained from the receiver 640. In one possible approach, the receiver provides the serial number of the transmitter 635 to the production line computer 645. The production line computer 645 accesses a pre-programmed database to correlate the serial number with data that identifies a specific component reel type. This identifying information is then included in the message to inform the supply facility worker of which type of reel is needed. Identifying information regarding the automated assembly machine, such as its location, can also be provided in the message to facilitate delivery. In another approach, the production line computer 645 combines the transmitter's address with the automated assembly machine's component part number, feeder position and machine module. Then, it automatically generates and transmits an e-mail ordering a replacement component reel.

When one transmitter is associated with multiple reels, the transmitter should encode information that identifies a particular reel in its transmitted signal. This information can then be conveyed by the production line computer 645 to the supply facility computer 660. It is also possible for the reel identifying information from the transmitter to be converted to a different, more useful format for communication in the message to the computer 660. For instance, the transmitter may only identify the partially depleted reel by its position relative to other reels, e.g., reel three of ten. In this case, the production line computer 645, when suitably programmed, can correlate the reel position with details of the reel type. These details can be forwarded to the supply facility computer 660. Or, this correlation may occur at the supply facility computer 660, with the additional input of an identifier of the production line computer 645, if needed. The identifier of the production line computer 645 may not be needed if all automated assembly machines in a production line are configured the same, at least with respect to the reels used.

As mentioned previously, the marks on the reel 600 may encode information that identifies the reel type, in addition to indicating that the reel 600 is being depleted. For example, this information can be encoded in a bar code, RF tag, or magnetically encoded. This information can be conveyed without modification in substance from the transmitter 635 to the receiver 640 and production line computer 645, and then to the supply facility computer 660.

Note that the production line computer 645 may not be needed if the receiver can communicate directly with the supply facility computer 660. This may be the case, e.g., if the receiver 640 is located proximate to the supply facility computer 660 but still within range of the transmitter 635. Or, a wired or wireless path may be provided from the receiver 640 to the supply facility computer 660. In this case, the supply facility computer 660 can perform the functions of the production line computer 645 discussed previously so that it provides the identifying information of the depleted reel on the display 670 in response to the signal from the transmitter 635.

Furthermore, a dedicated circuit such as an ASIC may be used in place of the production line computer and/or supply facility computer to convey a message to a supply facility. The message may be conveyed by pager, cell phone or radio, for instance.

A local alarm, such as a light and buzzer, can be activated near the automated assembly machine 630 to alert production line workers to the fact that the reel 600 is nearing depletion and to expect that a new reel will be delivered soon.

Figure 7:
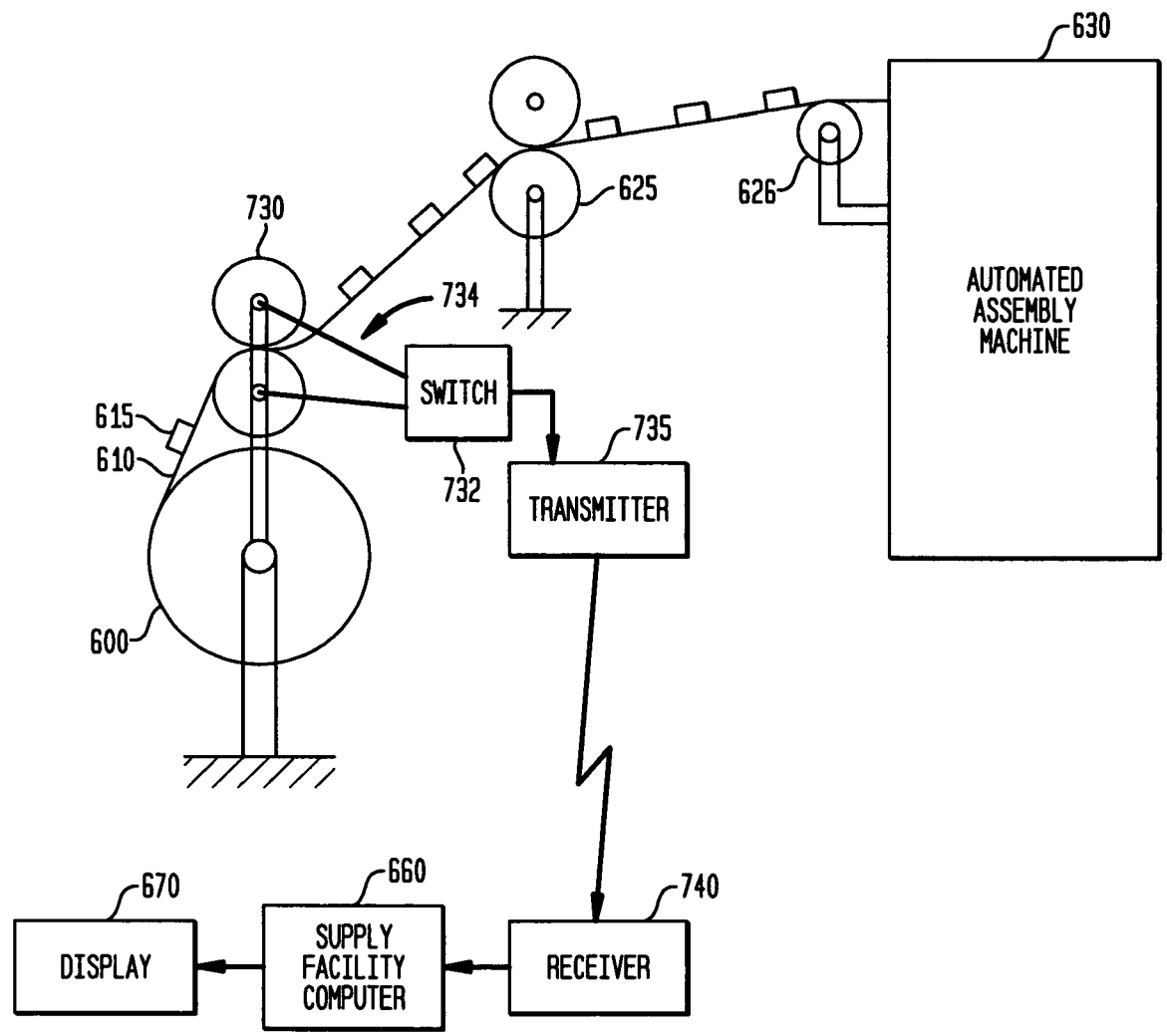
FIG. 7 illustrates a system for signaling when a supply reel has been depleted.

The system of FIG. 7 illustrates a direct communication from a transmitter to the supply facility computer in a different context. However, many of the features of FIG. 7 can be adapted for use in the system of FIG. 6. The system of FIG. 7 can also use elements of the system of FIG. 6, where information is first transmitted to a production line computer, and from there to the supply facility computer 660.

FIG. 7 illustrates a system for signaling when a supply reel has been depleted. In this approach, a conventional tape can be used and there is no need for special markings on the tape or for a reader to read such markings. In one possible example approach, the tape 610 passes through rollers 725 and 730, which are spring biased toward one another. For example, the rollers 725 and 730 may be spring-loaded pinch rollers. Additionally, the rollers 725 and 730 are made of an electrically conductive material such as metal, and are coupled in an electrical circuit 734 that includes a switch 732 so that when the rollers 725 and 730 touch one another, the switch circuit 732 is closed. This can be achieved in various ways that should be apparent to those skilled in the art. As the tape 610 is fed into the automated assembly machine 630, the rollers 725 and 725 remain apart and electrically isolated from one another. However, once the reel 600 has been fully depleted, and the end of the tape 610 has been unwound from the reel 600 and exits the rollers 725 and 730, the tape 610 no longer prevents the rollers 725 and 730 from contacting one another. As a result, the electrical circuit 734 is closed. When the switch 732 closes, a transmitter 735 is activated to send a signal indicating that the reel has been depleted and that a new reel is needed. This signal may carry information as discussed previously in connection with the transmitter 635 of FIG. 6. The transmitted signal is received by a receiver 740, which may be analogous to the receiver 640, and provided to the supply facility computer 660 to cause a message to be displayed on the display 670, also as discussed in connection with FIG. 6.

Moreover, although the system of FIG. 7 detects the full depletion of the reel 600, some time will remain, such as a few minutes, depending on the speed of the tape and the distance from the reel 600 to the input of the automated assembly machine 630, until the last component on the tape reaches the input of the automated assembly machine 630. This may allow time for delivery of the replacement reel, or at least minimize waiting time.

Record keeping functions can also be performed by the computers 645 and/or 660, such as to track the number and types of reels used in a given time period.

The invention has been described herein with reference to particular exemplary embodiments. Certain alterations and modifications may be apparent to those skilled in the art, without departing from the scope of the invention. The exemplary embodiments are meant to be illustrative, not limiting of the scope of the invention, which is defined by the appended claims.

What is claimed is:

1. An inventory management apparatus for an automated assembly machine that is fed components from a component reel, the component reel comprising a tape having the components carried at periodic locations along the tape, the apparatus comprising:

a reader for reading the tape, as the tape is fed to the automated assembly machine, to detect at least one indication on the tape the at least one indication is positioned at a location along the tape at which a predetermined portion of the component reel has been depleted, the predetermined portion indicating a percentage use of the component reel; and a transmitter responsive to the reader for transmitting a signal when the at least one indication is detected by the reader.

2. The inventory management apparatus of claim 1, further comprising:

a receiver for receiving the signal transmitted by the transmitter; and a computer responsive to the receiver for sending a message via a computer network that comprises a notification to supply the automated assembly machine with an additional component reel.

3. The inventory management apparatus of claim 2, wherein:
the message comprises an e-mail that is addressed to a computer at a supply facility.

4. The inventory management apparatus of claim 2, wherein:
the message comprises an identifier of a type of the component reel.

5. The inventory management apparatus of claim 4, wherein:
the signal comprises an identifier associated with the transmitter; and
the computer determines the identifier of the type of the component reel based on the identifier associated with the transmitter.

6. The inventory management apparatus of claim 2, wherein:
the message comprises an identifier of the automated assembly machine.

7. The inventory management apparatus of claim 6, wherein:
the signal comprises an identifier associated with the transmitter; and
the computer determines the identifier of the automated assembly machine based on the identifier associated with the transmitter.

8. The inventory management apparatus of claim 1, further comprising:
a receiver for receiving the signal transmitted by the transmitter; and
a computer responsive to the receiver for displaying a notification to a user to supply the automated assembly machine with an additional component reel.

9. The inventory management apparatus of claim 8, wherein:
the message comprises an identifier of a type of the component reel.

10. The inventory management apparatus of claim 9, wherein:
the signal comprises an identifier associated with the transmitter; and
the computer determines the identifier of the type of the component reel based on the identifier associated with the transmitter.

11. The inventory management apparatus of claim 8, wherein:
the message comprises an identifier of the automated assembly machine.

12. The inventory management apparatus of claim 11, wherein:
the signal comprises an identifier associated with the transmitter; and
the computer determines the identifier of the automated assembly machine based on the identifier associated with the transmitter.

13. The inventory management apparatus of claim 1, wherein:
the automated assembly machine comprises a surface mount technology pick and place machine.

14. The inventory management apparatus of claim 1, wherein:
the reader comprises an optical reader.

15. The inventory management apparatus of claim 1, wherein:
the reader comprises a magnetic reader.

16. The inventory management apparatus of claim 1, wherein:
the reader comprises an RF tag reader.

17. The inventory management apparatus of claim 1, wherein:
the transmitter transmits the signal as a wireless signal.

18. An inventory management method for an automated assembly machine which is fed components from a component reel, the component reel comprising a tape having the components carried at periodic locations along the tape, the method comprising:
reading the tape, as the tape is fed to the automated assembly machine, to detect at least one indication on the tape, the at least one indication is positioned at a location along the tape at which a predetermined portion of the component reel has been depleted, the predetermined portion indicating a percentage use of the component reel; and
transmitting a signal when the at least one indication is detected by the reader.

19. An inventory management apparatus for an automated assembly machine that is fed components from a component reel, the component reel comprising a tape having the components carried at periodic locations along the tape, the apparatus comprising:
first and second pinch rollers through which the tape travels as the tape is fed to the automated assembly machine;
an electrical circuit in which the first and second pinch rollers are arranged; wherein:
travel of the tape through the first and second pinch rollers prevents the first and second pinch rollers from contacting one another and closing the electrical circuit; and
when the tape no longer travels through the first and second pinch rollers, indicating that the component reel has been depleted, the first and second pinch rollers contact one another, thereby closing the electrical circuit; and
a transmitter responsive to the electrical circuit for transmitting a signal when the electrical circuit is closed.

20. An inventory management method for an automated assembly machine that is fed components from a component reel, the component reel comprising a tape having the components carried at periodic locations along the tape, the method comprising:
arranging, in an electrical circuit, first and second pinch rollers through which the tape travels as the tape is fed to the automated assembly machine; wherein:
travel of the tape through the first and second pinch rollers prevents the first and second pinch rollers from contacting one another and closing the electrical circuit; and
when the tape no longer travels through the first and second pinch rollers, indicating that the component reel has been depleted, the first and second pinch rollers contact one another, thereby closing the electrical circuit;
detecting when the electrical circuit is closed; and
transmitting a signal, responsive to the detecting, when the electrical circuit is closed.

* * * * *